United States Patent
Soika et al.

(10) Patent No.: US 8,309,495 B2
(45) Date of Patent: Nov. 13, 2012

(54) METHOD FOR THE PRODUCTION OF A SUPERCONDUCTING ELECTRICAL CONDUCTOR, AND A SUPERCONDUCTING CONDUCTOR

(75) Inventors: Rainer Soika, Hannover (DE); Dipl.~Ing Frank Schmidt, Hannover (DE)

(73) Assignee: Nexans, Paris (FR)

( * ) Notice: Subject to any disclaimer, the term of this patent is extended or adjusted under 35 U.S.C. 154(b) by 9 days.

(21) Appl. No.: 12/967,501

(22) Filed: Dec. 14, 2010

(65) Prior Publication Data

US 2011/0143945 A1 Jun. 16, 2011

(30) Foreign Application Priority Data

Dec. 15, 2009 (EP) .................................... 09306228

(51) Int. Cl.
*H01L 39/24* (2006.01)

(52) U.S. Cl. ...................... 505/431; 505/231; 174/125.1

(58) Field of Classification Search .................. 505/230, 505/231, 430, 431, 490, 491, 704, 822; 174/125.1; 428/551, 554, 545; 438/2
See application file for complete search history.

(56) References Cited

U.S. PATENT DOCUMENTS

| 6,038,462 A * | 3/2000 | Snitchler et al. ............. 505/231 |
| 6,370,405 B1 * | 4/2002 | Riley et al. .................... 505/231 |
| 6,569,360 B2 * | 5/2003 | Wu ............................. 252/518.1 |

FOREIGN PATENT DOCUMENTS

DE 19724618 A1 * 12/1998

* cited by examiner

*Primary Examiner* — Colleen Dunn
(74) *Attorney, Agent, or Firm* — Sofer & Haroun, LLP

(57) ABSTRACT

A method is specified for production of a superconducting electrical conductor which has a ceramic material as the superconducting material. A metal ribbon is formed around a multiplicity of flat strips of a mount which is coated with the superconducting ceramic material, running longitudinally to form a tube having a slot which runs in the longitudinal direction, and whose edges which rest on one another on the slot are welded to one another The tube which is closed by the welding process is then reduced to a diameter which corresponds approximately to the envelopes of all the strips which are located in the tube.

7 Claims, 1 Drawing Sheet

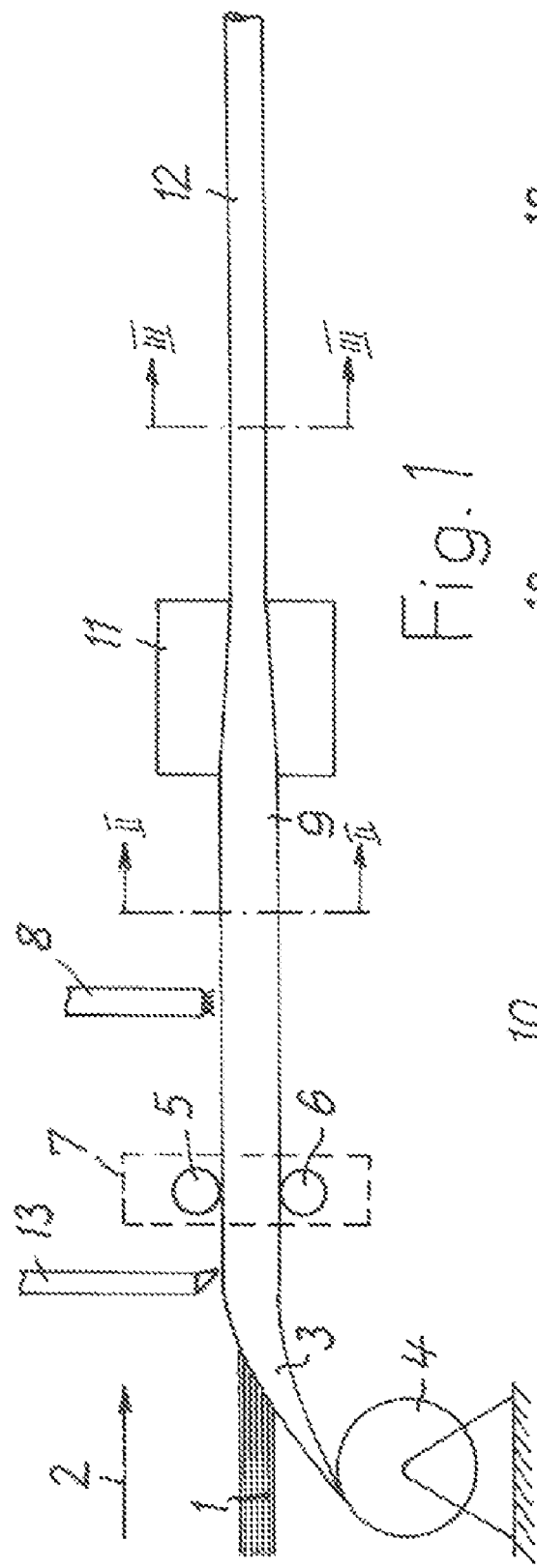

METHOD FOR THE PRODUCTION OF A SUPERCONDUCTING ELECTRICAL CONDUCTOR, AND A SUPERCONDUCTING CONDUCTOR

RELATED APPLICATION

This application claims the benefit of priority from European Patent Application No. 09 306 228.9, filed on Dec. 15, 2009, the entirety of which is incorporated by reference.

BACKGROUND

1. Field of the Invention

The invention relates to a method for the production of a superconducting electrical conductor which has a ceramic material as the superconducting material, and to a superconducting conductor.

2. Description of Related Art

A superconducting electrical conductor which can be produced using the method according to the invention is composed of a composite material whose superconducting ceramic material changes to the superconducting state at sufficiently low temperatures. The electrical direct-current resistance of a conductor formed from a material such as this is zero when adequate cooling is provided, provided that a specific current level is not exceeded. Suitable ceramic materials are, for example, BSCCO (bismuth-strontium-calcium-copper oxide) or ReBCO (rare-earth barium-copper oxide), in particular YBCO (yttrium-barium-copper oxide). By way of example, sufficiently low temperatures to change a material such as this to the superconducting state are between 67 K and 110 K. Suitable coolants are, for example, nitrogen, helium, neon and hydrogen, or mixtures of these substances.

U.S. Pat. No. 5,739,086 describes various methods for production of electrical conductors which are in the form of ribbons and are referred to as high-temperature superconductors. In the case of a BSCCO superconductor, the BSCCO material is, for example, introduced in powder form into a tube composed of silver, and is compressed. The superconducting state is achieved by mechanical deformation of the tube and subsequent heat treatment (annealing). In the case of a YRCO superconductor, which is particularly suitable for electrical cables and windings because of its excellent electrical characteristics, a buffer layer that is likewise composed of metal, is first of all applied to a ribbon, which for example is biaxially textured and composed of metal as a substrate, onto which buffer layer the YBCO material is the applied. The substrate is composed, for example, of nickel, copper or iron, or of an alloy of these materials. By way of example, copper or silver is used for the buffer layer. Finally, the YBCO material is likewise changed to the superconducting state by heat treatment. The superconducting conductor that is being produced in this way can—as already mentioned—advantageously be used in electrical cables as well as windings for electric motors and magnets. In this case, however, it can be bent in only one direction, because it is in the form of a ribbon.

The method according to the initially cited EP 1 916 720 B1 results in a round superconducting conductor being produced, which can be processed in the same way as a conventional wire without having to maintain a particular direction during bending. This known method is used to form a textured metallic substrate, which is in the form of a ribbon, first of all in its longitudinal direction about an elongated, metallic mount with a circular cross section, to form a slotted tube with edges which extend in the longitudinal direction and rest on one another on a slot. The slotted tube is then closed by welding the slot. The closed tube is then pulled down until it makes contact with the mount. The superconducting ceramic material is then applied to the tube all round, and the heat treatment process is finally carried out. This method has been proven in practice. However, it involves a relatively large amount of effort. The superconducting material located on the outside can furthermore easily be damaged unless additional measures are taken.

OBJECTS AND SUMMARY

The invention is based on the object of simplifying the method described initially and furthermore ensuring that the superconducting material of the conductor produced using the method is protected against mechanical damage.

According to the invention, this object is achieved, in that a metal ribbon is formed around a multiplicity of flat strips of a mount which is coated with the superconducting ceramic material, running longitudinally to form a tube having a slot which runs in the longitudinal direction, and whose edges which rest on one another on the slot are welded to one another, and in that the tube which is closed by the welding process is then reduced to a diameter which corresponds approximately to the envelopes of all the strips which are located in the tube.

When this method is used, all that is necessary is to separate a number of strips from a prefabricated ribbon, which has a mount coated with superconducting material, and to introduce this into the tube. By way of example, the tube is formed from a longitudinally running metal ribbon, using the technique known from EP 1 916 720 B1, and is welded to form a closed tube. Finally, the diameter of the closed tube is reduced until it surrounds all of the strips as closely as possible without exerting pressure on them. In the finished conductor the superconducting material is accommodated protected against mechanical damage within the tube. The conductor produced using this method can therefore be used without any special precautionary measures, and can be processed using commercially available apparatuses. The multiplicity of strips with superconducting material located in the tube results in the further advantage that the conductor produces only minor alternating-current losses in a corresponding cable during use.

A filling material is advantageously introduced into the tube, in addition to the strips, which filling material, together with the strips, fills the unobstructed dimensions of the tube. A material such as this is preferably a metal which melts at low temperatures, and with which the tube, which is still open, is filled in the liquid or viscous state. In the finished conductor, it surrounds the strips with the superconducting material in the solidified state, thus allowing the conductor to be electrically connected to other electrical conductors by means of conventional contact elements.

BRIEF DESCRIPTION OF THE DRAWINGS

The method according to the invention and the conductor produced using it will be explained using exemplary embodiments, with reference to the drawings, in which:

FIG. 1 shows a schematic illustration of an apparatus for carrying out the method according to the invention.

FIG. 2 shows an enlarged illustration of a section through FIG. 1, along the Line II-II.

FIG. 3 shows the conductor according to the invention in a section through FIG. 1 along the Line III-III, likewise illustrated enlarged.

FIG. 4 shows the conductor with a modified cross-sectional shape from that shown in FIGS. 2 and 3.

DETAILED DESCRIPTION

In general, ReBCO is used as the superconducting material for the conductor according to the invention, and in particular, YBCO, which is considered to be a special ReBCO material in the following description.

The production of ribbons with a mount on which YBCO is deposited is based, for example, on the initially cited U.S. Pat. No. 5,739,086. Ribbons such as these are commercially available and, for example, have a width of between 4 cm and 10 cm.

In order to carry out the method according to the invention, a prefabricated ribbon coated with YBCO is cut into strips with a width, for example, of 0.2 mm to 4 mm. The word "strip" used in the following text is a narrow, flat strip such as this comprising a mount coated with YBCO. This strip can first of all be cut from a ribbon, and can be wound onto a spool. However, it can also be processed further directly following the separation process.

By way of example, the method according to the invention is carried out as follows:

A relatively large number of strips 1 are moved in the direction of the arrow 2 by means of a pulling-off device, which is not also illustrated. A metal ribbon 3, which is pulled off a spool 4 by means of the same pulling-off device as the strips 1, is formed around the strips 1 longitudinally running in a forming unit 7, which is indicated by two rollers 5 and 6, to form a tube with a slot running in the longitudinal direction, on which the edges of the metal ribbon 3 rest on one another. The slot is then welded in a welding device 8. The tube 9 which has been closed in this way is illustrated in FIG. 2. The strips 1 are located in the lower area of the tube 9, which is closed in the upper area by a weld bead 10.

By way of example, the metal ribbon 3 may be composed of copper, aluminium or stainless steel, or else an alloy, such as bronze.

The tube 9 is reduced in a drawing unit 11, which follows in the pulling-off direction (arrow 2), to a diameter which corresponds approximately to the envelopes of all the strips 1 located in the tube 9, such that it virtually touches the strips 1, without exerting any pressure on them. The superconducting conductor 12 manufactured in this way is illustrated in FIG. 3.

In addition, where the tube is still open, it can be filled with a filling material by means of a feed unit 13. A low-melting-point metal is preferably used as the filling material, with which the tube is filled in the liquid or viscous state, and which is solid at room temperature, and in particular at the low temperatures used to produce the superconductivity. By way of example, one such metal is Wood's metal, which melts at 73° C. to 77° C., or Roses metal, with a melting point of about 95° C.

FIGS. 2 and 3 respectively show the conductors 9 and 12 as being circular. However, the conductor can also have a cross section which is not circular, for example a polygonal cross-sectional shape. The respective cross-sectional shape can advantageously be produced in the drawing unit 11. In one preferred embodiment, which is illustrated in FIG. 4, the conductor 12 has an approximately trapezoidal cross section with two mutually opposite curved side surfaces. A conductor such as this is particularly suitable as an individual element for construction of a conductor cable from a multiplicity of such conductors.

The invention claimed is:

1. Method for production of a superconducting electrical conductor, which has a ceramic material as the superconducting material, said method comprising the steps of:
    shaping a metal ribbon around a perimeter of a multiplicity of flat strips, each of said flat strips being coated with the superconducting ceramic material, wherein said shaping step includes running said metal ribbon longitudinally to form a tube around said flat strips such that said tube has a slot which runs in the longitudinal direction;
    with edges of said tube at said slot resting on one another, welding said edges to one another; and
    reducing the diameter of said tube, which is closed by the welding process, to a diameter which corresponds approximately to the size of the perimeter of the flat strips which are located in the tube such that said tube substantially contacts said flat strips and wherein said reduced diameter presses substantially all of said flat strips so as to be electrically connected with one another.

2. Method according to claim 1, wherein the tube is filled with filling material, in addition to the strips.

3. Method according to claim 2, wherein a low-mating-point metal is used as the filling material.

4. A superconducting electrical conductor produced using the method according to claim 1, wherein said multiplicity of flat strips coated with superconducting ceramic material, are arranged in said tube, made of metal and where said electrical conductor's unobstructed cross section is substantially completely filled by the strips.

5. Conductor according to claim 4, wherein the conductor has a circular cross section.

6. Conductor according to claim 4, wherein the conductor has a trapezoidal cross section with two mutually opposite curved side surfaces.

7. Method according to claim 1, wherein said tube substantially contacts said flat strips without exerting pressure on said flat strips.

* * * * *

UNITED STATES PATENT AND TRADEMARK OFFICE
CERTIFICATE OF CORRECTION

PATENT NO. : 8,309,495 B2
APPLICATION NO. : 12/967501
DATED : November 13, 2012
INVENTOR(S) : Rainer Soika and Dipl.- Ing Frank Schmidt It is certified that error appears in the above-identified patent and that said Letters Patent is hereby corrected as shown below:

Col. 4, Claim 3 Line 33 - "low-mating" should be "low-melting"

Signed and Sealed this
Nineteenth Day of March, 2013

Teresa Stanek Rea
*Acting Director of the United States Patent and Trademark Office*